United States Patent [19]

Pouliquen et al.

[11] Patent Number: 5,269,403
[45] Date of Patent: Dec. 14, 1993

[54] SPUTTERING TARGET ASSEMBY FOR A SPUTTER COATING APPARATUS

[75] Inventors: Benoit Y. Pouliquen, Spokane; Bill Willette, Veradale; Robert G. Delano, Valleyford; Timothy J. Drinnon, Spokane, all of Wash.

[73] Assignee: Johnson Matthey Electronics, Spokane, Wash.

[21] Appl. No.: 898,778

[22] Filed: Jun. 15, 1992

[51] Int. Cl.$^5$ .............................................. C23C 14/34
[52] U.S. Cl. ........................... 204/298.12; 204/298.18
[58] Field of Search ....................... 204/298.12, 298.18

[56] References Cited

U.S. PATENT DOCUMENTS 4,385,979 5/1983 Pierce et al. ...................... 204/209
4,855,033 8/1989 Hurwitt ........................... 204/298.09

*Primary Examiner*—Aaron Weisstuch
*Attorney, Agent, or Firm*—Cushman, Darby & Cushman

[57] ABSTRACT

A sputtering target assembly for a sputter coating apparatus includes a spacing ring which is threaded to a target holder and a target which attaches to the spacing ring at one side and fits into the target holder at another side. The target holder fits into a cathode body which functions as a magnetic pole piece, a portion of a cooling system, and a mechanical stabilizer for the target. The target holder also provides cooling, using cooling passages and the spacing means which is threaded to the target holder. The sputtering target has an arch-like face which promotes a controlled plastic deformation in a preselected direction, so that heating expansion during operation results in the target being urged into forceful and close contact with at least two cooled surfaces.

14 Claims, 2 Drawing Sheets

1

SPUTTERING TARGET ASSEMBY FOR A SPUTTER COATING APPARATUS

BACKGROUND OF THE INVENTION

1. Field of the Invention

This invention relates to a sputter coating apparatus, and more particularly, to the structure of a sputtering target and holder assembly used in such an apparatus.

2. Discussion of the Prior Art

Sputtering is a method for applying thin films to substrate materials, such as wafers used in manufacturing microelectronic components. The process occurs in a low-pressure chamber containing a gas which is typically argon. A negative potential is applied to a cathode structure, establishing an electric field, and electrons from the cathode collide with argon atoms, creating ions and exciting a glow discharge. Accelerated by the cathode's negative potential, the ions travel parallel to the electric field lines and impact a target, composed of the coating material, carried on the cathode structure. The kinetic energy of these ions is sufficiently high to dislodge some target surface atoms, which can condense on the substrate to form the film.

One technique, commonly referred to as magnetron sputtering, uses magnetic fields to enhance the ion bombardment of the target. Magnetic means induce a relatively strong field in the vicinity of the target face, with the magnetic field lines oriented generally perpendicular to those of the electric field. Electrons emitted from the target face are influenced by the magnetic field so that their path of notion becomes curved. Thus, the magnetic field traps the electrons near the target. This results in electron-argon collisions close to the target face, thereby maximizing the ion flux bombarding the target. See U.S. Pat. No. 4,472,259 for an illustration of a typical magnetron sputtering device.

A significant result of the ion bombardment is target heating. Ejection of target material is only one result of an ion impacting the target surface, and most of the system input power appears as heat in the target. Sputtering cathode systems are, therefore, sensitive to design changes that call for increased power, thereby causing an increase in target heating.

U.S. Pat. No. 4,855,033 to Hurwitt provides a cathode and target design which attempts to cool a target carried therein during high-power operations. Hurwitt also describes a sputtering target which is designed in an attempt to control its deformation to ensure effective cooling and retention of sputtering face orientation. In addition, the sputtering cathode assembly is described as combining the functions of a magnetic pole piece, a target cooling means, and a mechanical stabilizer for the target:

Specifically, FIG. 1 (PRIOR ART) shows an embodiment of the Hurwitt patent. The cathode assembly 20 includes support structures, a cathode body 23, a target nest 24 and target 26. The assembly is generally cylindrical in form, adapted for the coating of circular substrates such as wafers used in the manufacture of microelectronic components.

The cathode body is formed of a strong ferromagnetic material to enclose and stabilize the holder and target. The cathode body side walls include means for partially enclosing cooling passages, and they may also serve as a magnetic pole piece.

The target nest 24 is located in the central well of the cathode body, and takes the form of a relatively flat, hollow cylinder with a closed back 25 and side walls 27 defining a central cavity. It is composed of heat-conductive material. The back face of the nest conforms to the cathode body. The outer periphery of the holder and central area of its back side include means for partially enclosing coolant passages, the former in registration with cathode body enclosing means, to form coolant channels at the interface between the nest and the body, and other channels in the nest central area each of which is in fluid communication with coolant inlet and outlet means.

Sputtering target 26 is located within the central cavity of the nest, and preferably is an annular disk having a central aperture 53. It is composed of coating material. The target outer rim and the nest inner wall are formed with a helical thread 50, extending the entire vertical length of the wall. This structure permits the target to be screwed into the cavity.

The back face of the sputtering target 62 and the front face of the nest central cavity form complementary surfaces, with the target back face having a convex, arch-like shape, formed as either a convex curved surface or as two surfaces whose intersection encloses a obtuse angle, the apex of which projects outward from the target back face. In one embodiment, one surface is planar, generally normal to the cathode assembly access, and the other is conical. The target back face, therefore, permits a controlled deformation of the target under expansive stresses imposed by heat buildup, such that the target will be urged into forceful, close contact with the cooled surfaces of the holder during operation.

The target is cooled primarily through the side walls 28 of the cathode body, assisted by the nest/target cooling means 50. Also, some cooling exists at an inner rim/retainer convex surface 60.

There are, however, three major problems with the described structure of the Hurwitt patent. Firstly, the threaded target holder and target do not provide much additional cooling since it may often happen that only one surface of the thread is in contact with the cooled cathode. Secondly, it is difficult to install the target because the metal surfaces in contact with each other cannot be lubricated. This is so because sputtering is performed in a high vacuum with high purity targets, and lubricants are not compatible in this environment. Thirdly, after sputtering, it is common to experience some slight distortion of the target, and Hurwitt's design ensures that this distortion is directed towards the outside diameter. Thus, removing the target may become extremely difficult or even impossible without signicant damage to the target holder. For example, it is common for users to remove the target with a chisel and hammer.

SUMMARY OF THE INVENTION

It is an object of the present invention to provide a sputtering target assembly which can be easily installed.

A further object of the present invention is to provide a sputtering target assembly which can be removed easily.

Another object of the invention is to provide a sputtering target capable of sustained high-power operation.

Another object of the invention is to provide a sputtering target subjected to controlled deformation to ensure effective cooling and retention of sputtering face orientation.

This invention provides a sputtering target assembly which is compatible with the target holder and cathode body of the Hurwitt patent.

The present invention, in one embodiment, includes a target holder, an annular spacing means, and a sputtering target. One portion of the target holder fits into a cathode body and the other portion or surface includes a base and threaded side walls. The spacing means has an external threaded surface and a smooth internal surface, wherein the threaded surface engages the target holder threaded side walls. In addition, the spacing means is made of a conductive material, preferably copper, and is installed only once into the holder assembly.

The target is composed of a coating material and easily connects to the smooth internal surface of the spacing means. Locking means are used to lock the target to the spacing means.

The dimensions of the spacing means and target combination are similar to the dimensions of the target disclosed in Hurwitt. The target combination of the present invention also has a cooling capability equivalent to Hurwitt's, but the target combination offers a significant improvement in installing and removing the target.

DETAILED DESCRIPTION OF THE PREFERRED EMBODIMENT

Figure 1:
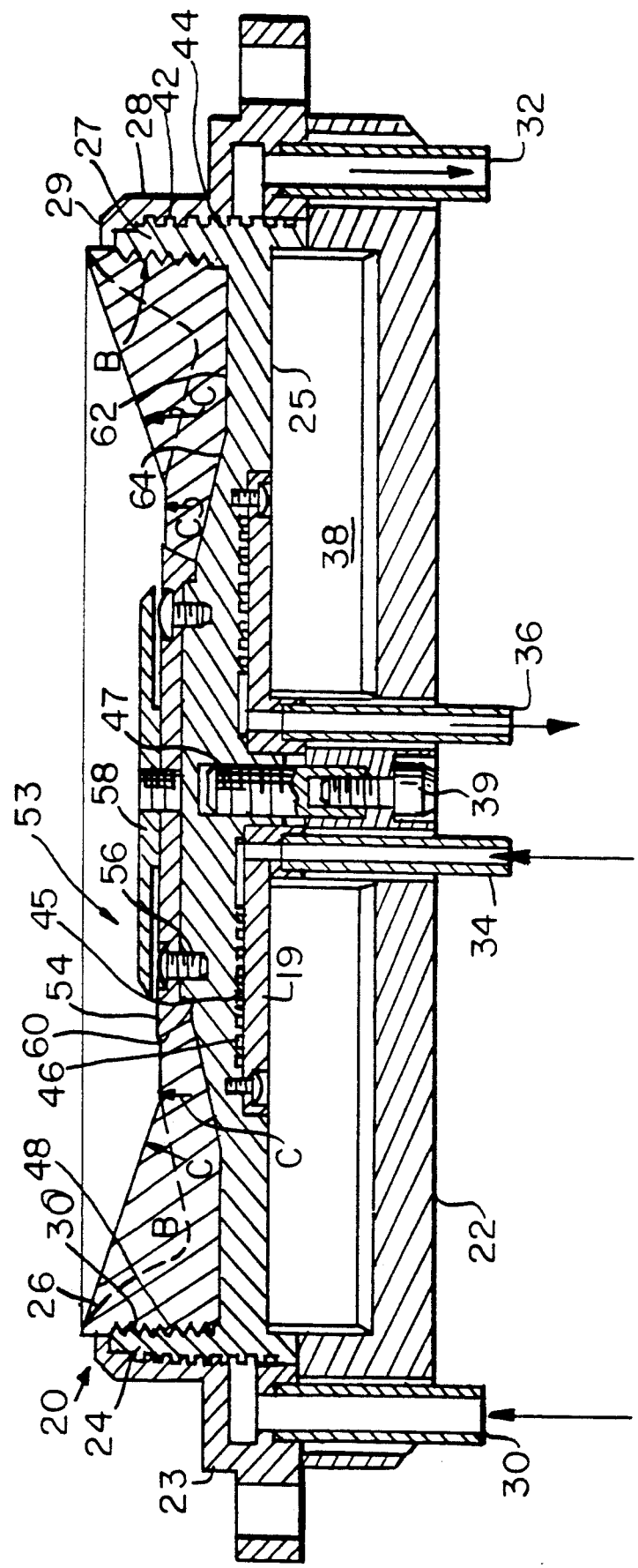
FIG. 1 (PRIOR ART) is a cross-section of a sputtering cathode known in the art.
Figure 2:
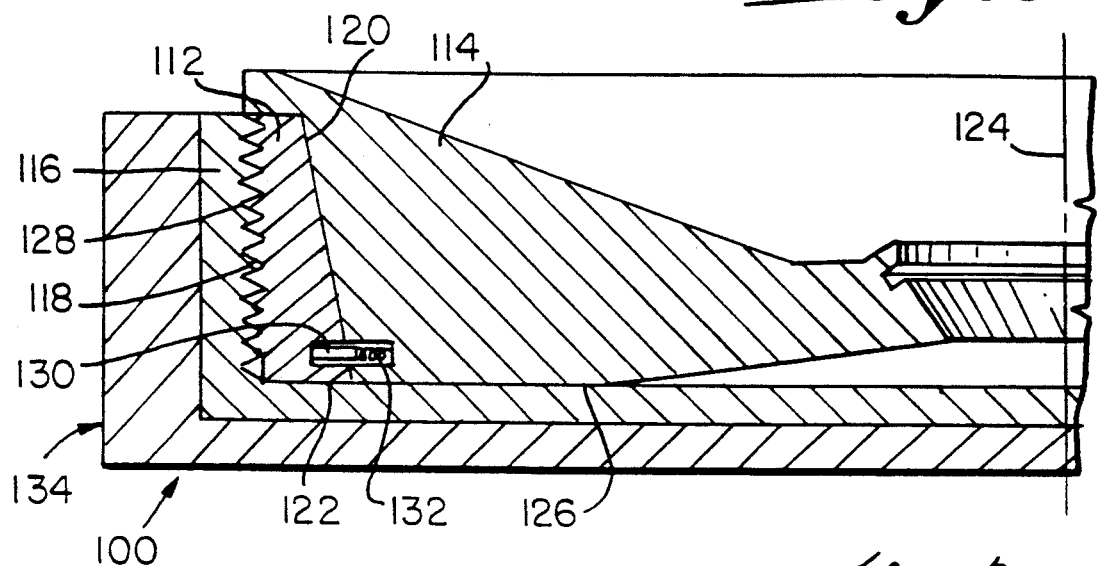
FIG. 2 is a cross-sectional side view of a preferred embodiment of the present invention.
Figure 3:
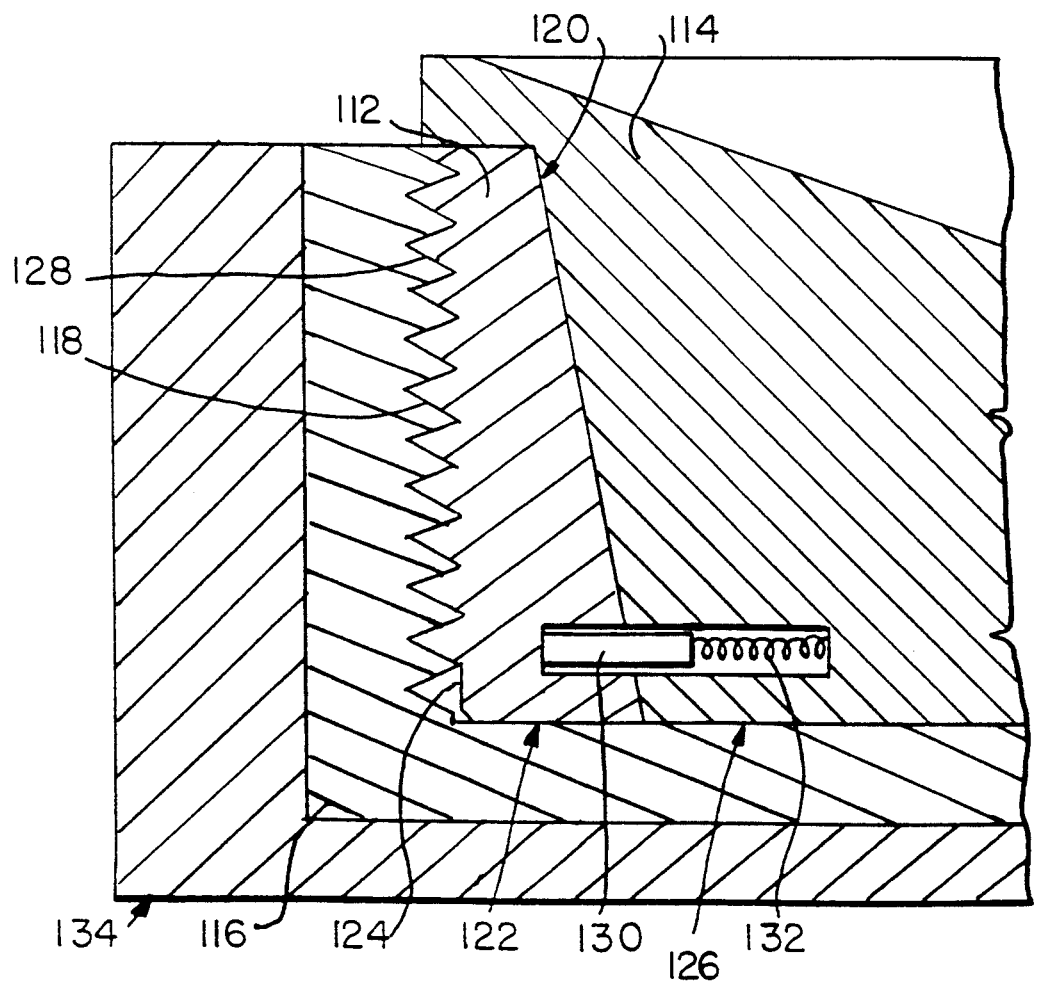
FIG. 3 is an expanded cross-sectional view of the preferred embodiment.

A sputtering target assembly, in accordance with the present invention, is designated generally by the reference character 100, as shown in FIGS. 2 and 3. As shown, the sputtering target assembly includes a spacing means 112, a sputtering target 114, and a target holder 116.

The spacing means 112 is made of a conductive metal, preferably copper, and is in the form of a ring. It will be understood, therefore, that the view of the ring 112 in the FIG. 2 is broken off at at the axis 124 which is the axis of symmetry in an actual embodiment. The spacing means may also be made of aluminum or gold. Spacing means 112 has an external threaded surface 118, an internal surface 120 and a base surface 122. A central axis 124 (FIG. 2) extends perpendicular to the base surface of the holder 116. The internal surface 120 and the base surface of the holder 116 define a sub-cavity, and internal surface 120 is smooth and slopes outwardly away from the central axis 124. The spacing means preferably takes the shape of an annular ring, as noted above,,but other shapes may be employed.

In one form, the target holder 116 fits within a cathode body 134 and has an interior base surface 126 and threaded side walls 128 defining a central cavity. The sub-cavity is smaller than the central cavity. Threaded surface 118 of the spacing means engages threaded side wall surface 128 of the target holder to improve heat transfer between the spacing means and the side wall of the target holder.

Sputtering target 114 fits into the sub-cavity defined by the spacing means and the base 126 of the target holder as shown.

The spacing means 112 is installed into the target holder 116 only once. However, the target 114 is provided with a slidable pin 130 which is biased by a spring 132 to lock the spacing means to the target. An annular cavity in the target contains the spring 132, so that the pin 130 and spring 132 lock into position upon insertion of the target. Other retention mechanisms may be suitable for holding the target in place.

The target 114 has a back-face which is convex with respect to the target, so that the back face undergoes a controlled deformation transverse to a general plane of the target during heat-induced expansion. The back face includes a planar portion and a conical portion which intersect to enclose an obtuse angle whose apex projects backwardly away from the target. The central cavity includes surfaces complementary to the planar and conical portions as shown in FIG. 2.

Alternatively, the back face includes a curved surface which is convex to the target, and the central cavity includes a curved surface complementary to the curved portion.

While the invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A sputtering target assembly for a sputter coating apparatus, comprising:
   a target holder having a base surface and side wall defining a central cavity, said side wall being at least partially threaded on a portion thereof facing said central cavity;
   spacing means having an exterior threaded surface for threadedly engaging said side wall of said central cavity, said spacing means including an internal surface defining a sub-cavity smaller than said central cavity for receiving a target therein and spacing the target from said side wall of said target holder, said spacing means having a central axis extending perpendicular to said base surface of said target holder; wherein said internal surface of said spacing means is smooth and slopes outwardly away from said central axis.

2. The invention as claimed in claim 1 wherein said spacing means is formed from a conductive material.

3. The apparatus as claimed in claim 2, wherein said conductive material is copper.

4. The apparatus as claimed in claim 2, wherein said conductive material is aluminum.

5. The apparatus as claimed in claim 2, wherein said conductive material is gold.

6. The apparatus as claimed in claim 1, wherein said exterior surface of said spacing means is threaded entirely about the periphery thereof to improve heat transfer between said spacing means and said side wall.

7. The apparatus as claimed in claim 1, further comprising an interengaging locking means, for locking said spacing means to a target.

8. The apparatus as claimed in claim 7, wherein said locking means includes a movable pin urged to a locking position by resilient means which is carried by the target.

9. The invention as claimed in claim 8 wherein said target includes an annular cavity in which said pin is slidable and said resilient means is a spring member received in said annular cavity formed in said target adjacent to said base of said target.

10. The apparatus as claimed in claim 1, wherein said sub-cavity surrounds a base portion of said holder and is formed to receive said target, and said target has a back face which is convex with respect to said target, whereby said back face undergoes a controlled deformation transverse to a general plane of said target during heat-induced expansion.

11. The apparatus as claimed in claim 10, wherein said back face includes a planar portion and a conical portion, said portions intersecting to enclose an obtuse angle whose apex projects backwardly away from said target, and said central cavity includes surfaces complementary to said planar and conical portions.

12. The apparatus as claimed in claim 10, wherein said back face includes a curved surface, convex to a body of said target, and said central cavity includes a curved surface complementary to said curved portion.

13. The invention as claimed in claim 1 wherein said spacing means is an annular ring.

14. A sputtering target assembly for a sputter coating apparatus, comprising:
   a target holder having a base surface and a side wall defining a central cavity, said side wall being at least partially threaded on a portion thereof facing said central cavity;
   spacing means having an exterior threaded surface for threadedly engaging said side wall of said central cavity, said spacing means including an internal surface defining a sub-cavity smaller than said central cavity for receiving a target therein and spacing the target from said side wall of said target holder, said spacing means having a central axis extending perpendicular to said base surface of said target holder, said spacing means including an external wall having a dimension substantially equal to the height of said side wall and corresponding to the depth of said central cavity, said external wall being threaded over said dimension to cooperate with the threads of said side wall of said central cavity.

* * * * *